United States Patent [19]
Gardner et al.

[11] Patent Number: 5,937,301
[45] Date of Patent: Aug. 10, 1999

[54] METHOD OF MAKING A SEMICONDUCTOR DEVICE HAVING SIDEWALL SPACERS WITH IMPROVED PROFILES

[75] Inventors: Mark I. Gardner, Cedar Creek; Daniel Kadosh, Austin, both of Tex.

[73] Assignee: Advanced Micro Devices, Austin, Tex.

[21] Appl. No.: 08/912,839

[22] Filed: Aug. 19, 1997

[51] Int. Cl.⁶ .................................................. H01L 21/336
[52] U.S. Cl. ........................ 438/303; 438/585; 438/595; 438/596; 438/791; 438/970; 438/724
[58] Field of Search .................. 438/303, 585, 438/595, 596, 791, 970, 724

[56] References Cited

U.S. PATENT DOCUMENTS

| | | | |
|---|---|---|---|
| 4,486,943 | 12/1984 | Ryden et al. ............................ | 438/303 |
| 4,528,211 | 7/1985 | Bhagat .................................... | 438/303 |
| 4,575,921 | 3/1986 | Bhagat .................................... | 438/303 |
| 5,472,890 | 12/1995 | Oda ......................................... | 438/303 |
| 5,691,212 | 11/1997 | Tsai et al. ............................... | 438/303 |
| 5,710,054 | 1/1998 | Gardner et al. ......................... | 438/303 |
| 5,811,342 | 9/1998 | Wu .......................................... | 438/303 |
| 5,817,562 | 10/1998 | Chang et al. ............................ | 438/305 |

*Primary Examiner*—John F. Niebling
*Assistant Examiner*—Lynne A. Gurley
*Attorney, Agent, or Firm*—Merchant, Gould, Smith, Edell, Welter & Schmidt, P.A.

[57] ABSTRACT

A semiconductor device having improved spacers and a process for fabricating the same is provided. The semiconductor device is formed by forming at least one gate electrode over a substrate and forming a spacer layer over the gate electrode. A nitrogen bearing species is implanted into the spacer layer and portions of the spacer layer are removed, using the implanted nitrogen bearing species as a stop point, in order to form spacers on sidewalls of the gate electrode. Removal of the spacer layer may, for example, be performed using a dry or wet etch process.

22 Claims, 4 Drawing Sheets

METHOD OF MAKING A SEMICONDUCTOR DEVICE HAVING SIDEWALL SPACERS WITH IMPROVED PROFILES

FIELD OF THE INVENTION

The present invention is directed generally to semiconductor devices and, more particularly, to a semiconductor device having sidewall spacers with improved profiles and method of manufacture thereof.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which a gate electrode 103 is disposed. The gate electrode 103 is typically a heavily doped conductor having uniform conductivity. An input signal is typically applied to the gate electrode 103 via a gate terminal (not shown). Heavily doped source/drain regions 105 are formed in the semiconductor substrate 101 and are connected to source/drain terminals (not shown). As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain region refers generally to an active region used for the formation of a source or drain. A channel region 107 is formed in the semiconductor substrate 101 beneath the gate electrode 103 and separates the source/drain regions 105. The channel is typically lightly doped with a dopant type opposite to that of the source/drain regions 105. The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain regions 105 or channel region 107.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner an electric field controls the current flow through the channel region 107. This type of device is commonly referred to as a MOS field-effect-transistor (MOSFET).

Semiconductor devices, like the one described above, are used in large numbers to construct most modern electronic devices. As a larger number of such devices are integrated into a single silicon wafer, improved performance and capabilities of electronic devices can be achieved. In order to increase the number of semiconductor devices which may be formed on a given surface area of a substrate, the semiconductor devices must be scaled down (i.e., made smaller). This is accomplished by reducing the lateral as well as vertical dimensions of the device structure.

In the formation of the source/drain regions 105, spacers 111 are typically formed on the sidewalls of the gate electrode 103 in order to space a source/drain implant from the channel region 107. As device dimensions are reduced, it is necessary to scale the characteristics of the spacers 111. With conventional techniques, the formation of spacers is difficult to control. For example, as spacer dimensions are scaled down, spacers formed using conventional techniques typically nonuniformly cover the sidewalls of the gate electrode.

SUMMARY OF THE INVENTION

Generally, the present invention provides a semiconductor device having spacers with improved profiles on the sidewalls of gate electrodes and a method of manufacturing such a device.

In accordance with one embodiment of the invention, a semiconductor device is formed by forming at least one gate electrode over a substrate and forming a spacer layer over the gate electrode. A nitrogen bearing species is implanted into the spacer layer and portions of the spacer layer are removed, using the implanted nitrogen bearing species as a stop point, in order to form spacers on sidewalls of the gate electrode. Removal of the spacer layer may, for example, be performed using a dry or wet etch process.

An exemplary semiconductor device, consistent with an embodiment of the invention, includes a substrate and at least one gate electrode disposed over the substrate. On a sidewall of the gate electrode is disposed a spacer having a higher concentration of nitrogen at an upper portion than a lower portion. The spacer may, for example, have a width ranging from about 50 to 350 angstroms. The spacer may, for example, further have relatively planar side and top surfaces and provide relatively uniform coverage of the gate electrode sidewall.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
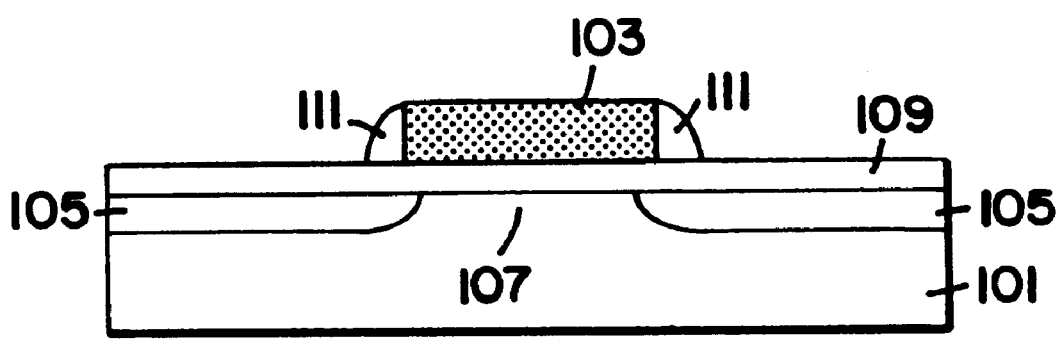
FIG. 1 illustrates one typical MOS semiconductor device structure.

While the invention is amenable to various modifications and alternative forms, specifics thereof have been shown by way of example in the drawings and will be described in detail. It should be understood, however, that the intention Is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices, including in particular MOS, complimentary MOS (CMOS), and bipolar CMOS (BiCMOS) structures. While the present invention is not so limited, an appreciation of various aspects of the invention will be gained through a discussion of the fabrication process and characteristics of such a device in connection with the examples provided below.

Figure 2A:
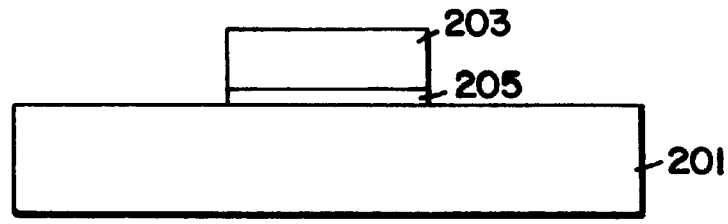
FIGS. 2A–2D illustrate an exemplary fabrication process in accordance with one embodiment of the invention.

FIGS. 2A–2D illustrate a process for fabricating a semiconductor device having sidewall spacers with improved profiles. Using known techniques, one or more gate electrodes (only one of which is shown) are formed on a substrate 201. The gate electrode 203 is typically insulated from the substrate 201 by a thin gate oxide 205. The resultant structure is illustrated in FIG. 2A. It will be appreciated that a number of different known fabrication techniques could be used to obtain the gate electrode structure depicted as FIG. 2A.

Figure 2B:
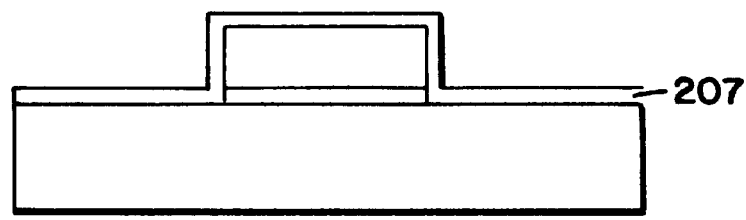

A spacer layer 207, typically an oxide such as $SiO_2$, is formed over the substrate 201, as illustrated in FIG. 2B. The spacer layer 207 may be formed using, for example, well-known deposition techniques. In one particular embodiment, the spacer layer 207 is conformally deposited using, for example, a low pressure chemical vapor deposition (LPCVD) or tetraethyl orthosilicate (TEOS) deposition techniques. The thickness of the spacer layer 207 varies with design parameters. Spacer layer 207 depths of 50 to 350 angstroms (Å) would be suitable for many small spacer applications. However, the invention is not so limited. Thicker spacer layers (e.g., ranging up to 2,000 Å) may be used if wider spacers are desired.

Figure 2C:
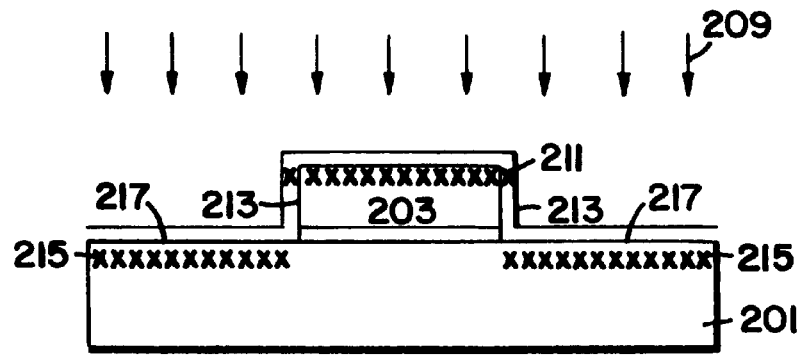

The structure depicted in FIG. 2B is implanted with a nitrogen bearing species 209, such as $N_2$ or 14N, to form a nitrogen peak 211 in the vertical portions 213 of the spacer layer 207 adjacent the sidewalls of the gate electrode 203. The nitrogen concentration peak 211 advantageously provides a stop point or etch stop for a subsequent spacer layer removal process. Implantation energies and concentrations are typically selected in consideration of the depth of the nitrogen peak 211. Suitable implantation energies and concentrations for a nitrogen implant range from about 5 KeV to 80 KeV and 1E14 to 2E16 atoms/cm$^2$, respectively. The resultant structure is illustrated in FIG. 2C.

The nitrogen profile in the vertical portions 213 of the spacer layer can vary with the implant characteristics and with the depth of the gate electrode 203. For example, where the gate electrode 203 is relatively thick (e.g., 1000 to 2000 Å), implanted nitrogen may be substantially confined to upper portions of the vertical spacer layer portions 213. With thinner gate electrodes 203 (e.g., 500 to 1000 Å thick), implanted nitrogen may be distributed throughout the vertical portions 213 of the spacer layer 207.

In the illustrated embodiment, the nitrogen implant energy provides a nitrogen peak below the upper surface of the gate electrode 203 and, in this manner, provides nitrogen 215 in the gate electrode 203 as well as in the active regions 217 of the device adjacent the gate electrode 203. Incorporation of nitrogen 215 in the gate electrode 203 and active regions 217 can enhance the performance of the device. For example, nitrogen in the gate electrode 203 can suppress boron diffusion into the channel region in PMOS devices. Nitrogen in the active regions 217 can, for example, suppress lateral diffusion of boron into the channel region in PMOS devices.

In some embodiments the substrate 201 is annealed after implanting the nitrogen bearing species. The anneal serves to distribute nitrogen in the vertical portions 213 of the spacer layer 207 as well as in the gate electrode 203 and active regions 217. This anneal can, for example, be used to provide nitrogen in lower portions of the vertical portions 213 of the spacer layer 207, especially when thicker gate electrodes are employed. While the anneal serves to diffuse nitrogen, it should be appreciated that the concentration peak typically remains in place. The annealing temperature and time is selected based on the desired concentration profile of nitrogen in the various regions. A rapid thermal anneal would be suitable for many applications.

Figure 2D:
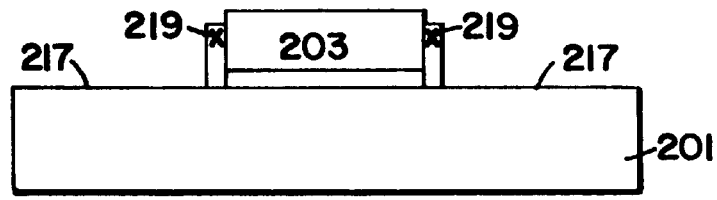

After implanting the nitrogen bearing species, portions of the spacer layer 207 are removed, using the implanted nitrogen bearing species as a stop point, in order to form spacers 219 on sidewalls of the gate electrode 203. Typically, removal of the spacer layer 207 also exposes the surface of the substrate 201 in the active regions 217. The resultant structure is illustrated in FIG. 2D. As should be appreciated, the spacers 219 generally have a higher concentration of nitrogen at the top than near the base.

The spacer layer 207 may be removed using, for example, well-known wet or dry etch processes. The nitrogen in the spacer layer 207 generally allows greater control over the etch process and the resultant spacer profile. In particular, the nitrogen peak 204 advantageously defines an etch stop for the spacer layer 207 removal process. Using dry etch processes (such as a plasma etch), spacers 219 having relatively planar top and side surfaces can be formed. The relatively planar side surface results in a more uniform coverage of the sidewall of the gate electrode as compared to conventional techniques. Using wet etch processes, spacers 219 having relatively planar top surfaces can be formed and, where nitrogen extends throughout the vertical portions 213 of the spacer layer 207, relatively planar side surfaces can also be formed. The presence of nitrogen in the spacers 219 also serves to decrease the susceptibility of the device to hot carrier injection effects.

As noted earlier, the above process can be used to form a number of different semiconductor devices, including but not limited to MOS structures such as PMOS, NMOS, CMOS, and BiCMOS devices. In addition, the above process can be used in conjunction with a number of different types of source/drain regions. For purposes of illustration and not of limitation, two exemplary processes for forming source/drain regions are discussed below with respect to FIGS. 3A–3B and 4A–4C.

Figure 3A:
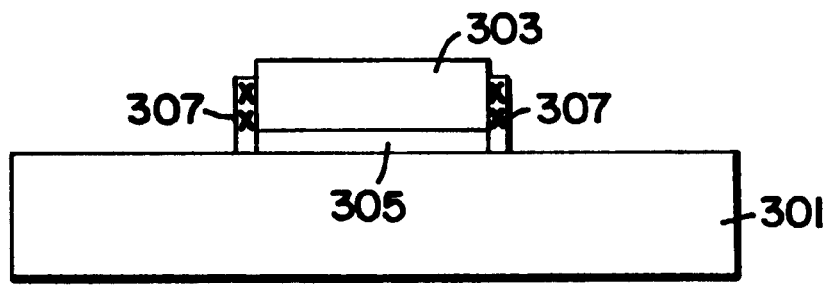
FIGS. 3A–3B illustrate an exemplary fabrication process in accordance with another embodiment of the invention.

Using the process described above, one or more gate electrodes (only one of which is shown) are formed on a substrate 301 and spacers 307 are formed on the sidewalls of the gate electrode 303. The gate electrode 303 is typically insulated from the substrate 301 by a thin gate oxide 305. The resultant structure, illustrated in FIG. 3A, is similar to that of FIG. 2D discussed above.

Figure 3B:
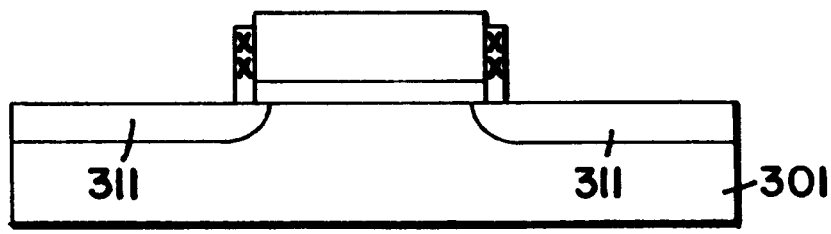

A source/drain implant of a dopant 309 (such as boron or arsenic) is performed to activate the gate electrode 303 and form source/drain regions 311 adjacent the gate electrode 303. The resultant structure is shown in FIG. 3B. Fabrication may continue with well-known processes, such as silicidation and contact formation. If desired, additional, wider spacers may be formed adjacent the gate electrode 303 prior to silicidation. In some embodiments, an LDD implant may be used in conjunction with (typically preceding) the source/drain implant to form lightly-doped drain (LDD) source/drain regions. The source/drain implant (and LDD implant) may be performed using, for example, well-known techniques.

Figure 4A:
FIGS. 4A–4C illustrate an exemplary fabrication process in accordance with another embodiment of the invention.
Figure 4B:
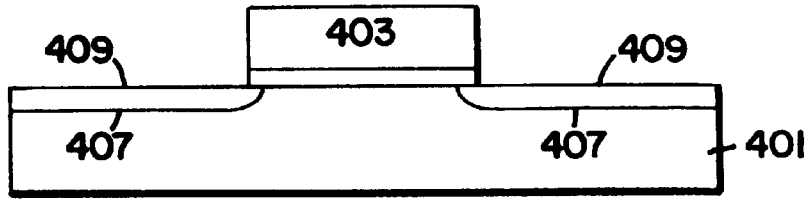
Figure 4C:
Figure 4C:
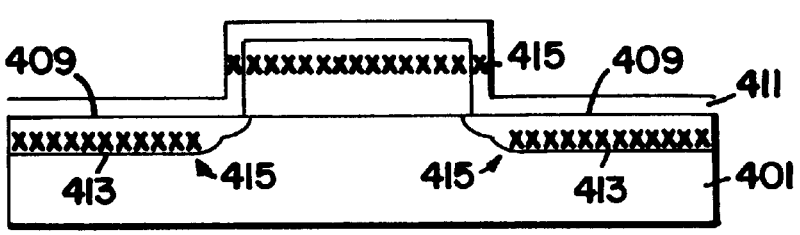

Another exemplary process for forming source/drain regions is illustrated in FIGS. 4A–4C. In this process, one or more gate electrodes are formed over a substrate 401. The gate electrode 403 may be formed using a number of different known fabrication techniques. Using the gate electrode 403 for alignment, a dopant 405 is implanted into the substrate 401 to form lightly-doped regions 407 in the active regions 409 of the substrate 401. The resultant structure is illustrated in FIG. 4A. The implant may be performed using well-known techniques.

A spacer layer 411 is formed over the substrate 401 and implanted with a nitrogen bearing species to form a nitrogen peak 415 which will be used as a stop point during subsequent processing. The spacer layer formation and nitrogen implant may be performed in a similar manner as discussed above. With the spacer layer 411 present, a dopant is implanted to form heavier-doped regions 413 in the active regions 409 of the substrate 401. Together the heavier-doped regions 413 and lightly-doped regions 407 form LDD source/drain regions 415. The resultant structure is illustrated in FIG. 4B. This implant may be performed using well-known techniques with energy levels sufficient to penetrate the spacers layer 411.

Portions of the spacer layer 411 are removed to form spacers 417 on sidewalls of the gate electrode 403 using the nitrogen peak as a stop point. This removal process may be performed in a similar manner as discussed above. The resultant structure is illustrated in FIG. 4C. Fabrication may continue with well-known processes such as silicidation and contact formation. In some embodiments, additional, wider spacers may be formed adjacent the gate electrode 403 prior to silicidation.

As noted above, the present invention is applicable to the fabrication of a number of different devices, such as PMOS, NMOS, CMOS, and BiCMOS devices, having spacers with improved profiles adjacent a gate electrode. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A process for forming a semiconductor device, comprising:

forming at least one gate electrode over a substrate;

forming a spacer layer over the gate electrode;

implanting a nitrogen bearing species into the spacer layer;

removing portions of the spacer layer using the implanted nitrogen bearing species as a stop point to form spacers on sidewalls of the gate electrode.

2. The process of claim 1, wherein forming the spacer layer includes depositing an oxide over the gate electrode.

3. The process of claim 2, wherein the oxide is conformally deposited.

4. The process of claim 1, wherein the spacer layer has a thickness ranging from about 50 to 2000 Å.

5. The process of claim 1, wherein the spacer layer has a thickness ranging from about 50 to 350 Angstroms.

6. The process of claim 1, wherein the nitrogen bearing species includes $N_2$.

7. The process of claim 1, wherein the nitrogen bearing species includes 14N.

8. The process of claim 1, wherein the nitrogen bearing species is implanted at an energy level ranging from about 5 to 80 KeV.

9. The process of claim 1, wherein the nitrogen bearing species is implanted at a concentration ranging from about 1E14 to 2E16 atoms/$cm^2$.

10. The process of claim 1, further including annealing the substrate after implanting the nitrogen bearing species.

11. The process of claim 1, wherein the nitrogen bearing species implant forms a nitrogen concentration peak in the spacer layer beneath the top surface of the gate electrode.

12. The process of claim 1, wherein removing portions of the spacer layer includes etching the spacer layer.

13. The process of claim 12, wherein the spacer layer is etched using a dry etch process.

14. The process of claim 12, wherein the spacer layer is etched using a wet etch process.

15. The process of claim 1, wherein the spacers are formed with a relatively planar top surface.

16. The process of claim 1, wherein the spacers are formed with a relatively planar side surface.

17. The process of claim 1, wherein removing portions of the spacer layer exposes active regions of the substrate adjacent the gate electrode.

18. The process of claim 1, further including implanting a dopant to form a lightly-doped region in the substrate prior to forming the spacer layer and after forming the gate electrode.

19. The process of claim 1, further including implanting a dopant to form a lightly-doped region in the substrate after removing portions of the spacer layer.

20. The process of claim 1, further including implanting a dopant to form source/drain regions in the active regions after forming the spacer layer and prior to removing portions of the spacer layer.

21. The process of claim 1, further including implanting a dopant to form source/drain regions in the active regions after removing portions of the spacer layer.

22. A process for forming a semiconductor device, comprising:

forming at least one gate electrode on a substrate;

depositing an oxide layer over the gate electrode, a portion of the oxide layer being deposited adjacent the sidewalls of the gate electrode;

implanting a nitrogen bearing species into the spacer layer to form an etch stop in the portions of the oxide layer adjacent the sidewalls;

etching the spacer layer using the etch stop to form spacers on sidewalls of the gate electrode.

* * * * *